United States Patent [19]

Hampel

[11] 3,825,770

[45] July 23, 1974

[54] MULTI-FUNCTION LOGIC GATE

[75] Inventor: Daniel Hampel, Westfield, N.J.

[73] Assignee: RCA Corporation, New York, N.Y.

[22] Filed: Oct. 10, 1972

[21] Appl. No.: 295,852

[52] U.S. Cl. ................ 307/203, 307/211, 307/215, 307/218, 330/30 D

[51] Int. Cl. .......................................... H03k 19/08

[58] Field of Search .......... 307/215, 218, 213, 211, 307/228, 235; 330/30 D; 328/94

[56] References Cited

UNITED STATES PATENTS

| | | | |
|---|---|---|---|
| 3,262,066 | 7/1966 | Trilling | 330/30 D |
| 3,271,528 | 9/1966 | Yallese | 330/30 D |
| 3,471,791 | 10/1969 | Scarr | 330/30 D |
| 3,477,031 | 11/1969 | Nagata | 330/30 D |
| 3,529,182 | 9/1970 | Jornod | 330/30 D |
| 3,550,040 | 12/1970 | Sinusas | 330/30 D |
| 3,568,081 | 3/1971 | Pinckaers | 330/30 D |
| 3,636,384 | 1/1972 | Dewitt | 330/30 D |
| 3,678,292 | 7/1972 | Hampel | 307/215 |
| 3,681,616 | 8/1972 | Mori | 307/218 |
| 3,686,512 | 8/1972 | Kross | 307/218 |

*Primary Examiner*—John S. Heyman

*Attorney, Agent, or Firm*—H. Christoffersen; Henry I. Schanzer

[57] ABSTRACT

A pair of current carrying lines, and a plurality of signal controlled means, each such means supplying a current to one or the other of the current carrying lines depending upon the binary value represented by the signal controlling that signal controlled means. Connected to at least one of the current carrying lines is a summing network comprised of "N" resistors connected in series for simultaneously producing N different logic functions of the signals applied to said signal controlled means.

11 Claims, 2 Drawing Figures

MULTI-FUNCTION LOGIC GATE

BACKGROUND OF THE INVENTION

It previously has been proposed to employ switches, such as current mode switches for logic gates. In response to a signal representing one binary value, such as a 1, a swich transmits a current to one line and in response to a signal representing the other binary value —0, the switch transmits a current to a second line. The out lines from the various switches may be connected to terminals at which signals representing two logic functions may be obtained. Where more than two different logic functions of the same input signals are needed, separate and/or additional logic gates are normally required.

In some applications, it may be desirable to be able to produce a large number of logic functions using the same logic gate. This could result in a considerable savings in the component count, the power dissipation and the number of connections. Also, the number of logic functions per component or per chip area would be maximized. Needless to say, this is an extremely important consideration in the production of circuits, be they discrete or large scale integrated circuits.

SUMMARY OF THE INVENTION

A logic gate having at least one summing network and a plurality of signal controlled means, each means receptive of a signal representing a binary digit, and each means either supplying or not supplying a current to said summing network depending upon the value of the binary digit its signal represents. The summing network includes N resistors connected in series for producing N different functions of the signals applied to each signal controlled means; where N is an integer greater than 1.

DETAILED DESCRIPTION OF THE INVENTION

Figure 1:
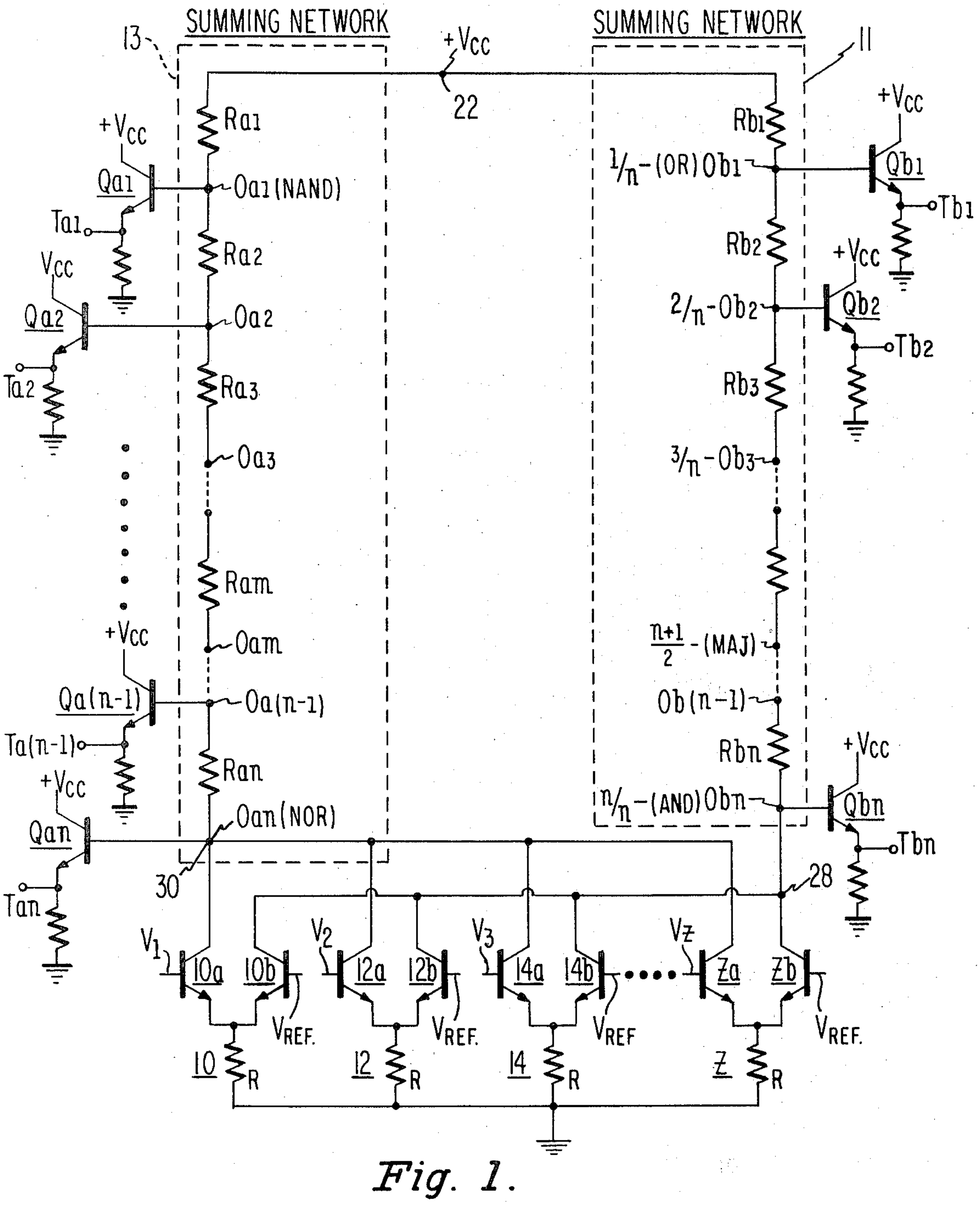
FIG. 1 is a schematic diagram of a threshold gate embodying one aspect of the invention.

The input threshold gate of FIG. 1 includes a plurality of pairs of transistors, four pairs 10, 12, 14, and Z of which are illustrated. Each transistor pair, such as 10, includes an *a* transistor and a *b* transistor connected at their emitters through an emitter resistor R to a point of potential 20, which may be ground. The first transistor, such as 10*a*, of each pair receives an input signal, such as V1, at its base and the second transistor, such as 10*b*, of each pair receives a reference signal, $V_{REF}$, at its base. In the example illustrated which employs npn transistors, the reference signal is positive, with respect to ground.

The collectors of the *a* transistors are connected via a common conductor to junction point 30 ($O_{an}$—the *n*th output on the *a* side) and the collectors of the *b* transistors are connected via a common conductor to junction point 28 ($O_{bn}$—the *n*th output on the *b* side).

A source of positive potential of amplitude $V_{cc}$ is connected to terminal 22. A first summing network, 11, is connected between terminals 22 and 28. The network, 11, includes *n* resistors ($R_{bl}$ through $R_{bn}$) connected in series and *n* output junction points ($O_{bl}$ through $O_{bn}$), there being an output junction point at one end of each resistor. A second summing network, 13, is connected between terminals 22 and 30. The network includes *n* resistors ($R_{a1}$ through $R_{an}$) connected in series and *n* output junction points ($O_{a1}$ through $O_{an}$), there being an output junction point at one end of each resistor.

Figure 2:
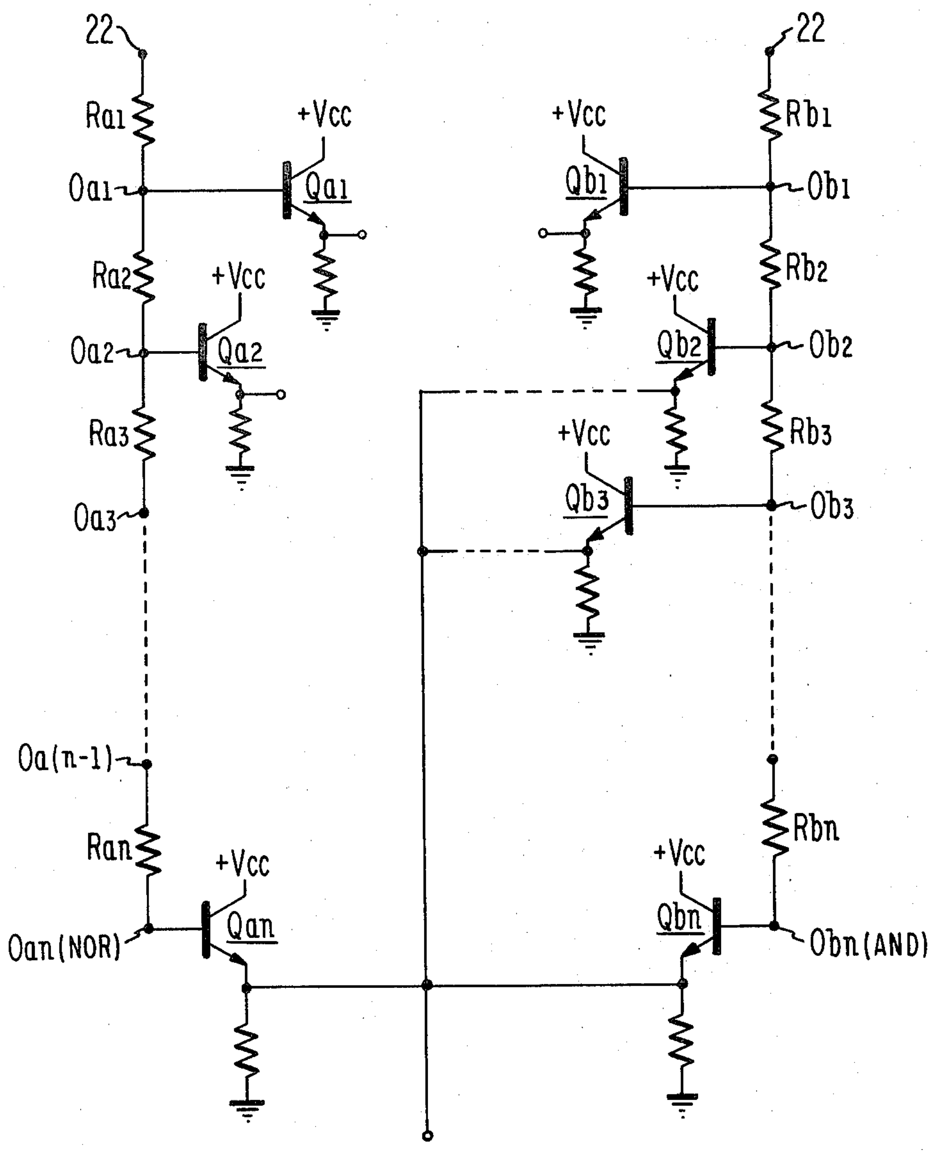
FIG. 2 is a schematic diagram illustrating the virtual "oring" of the outputs of FIG. 1.

The signals generated at the output junction points ($O_{ai}$, $O_{bi}$ where *i* varies from 1 to *n*) are coupled to output terminals ($T_{ai}$, $T_{bi}$) by means of emitter follower transistors ($Q_{ai}$, $Q_{bi}$) as shown in FIG. 1. The emitter followers shift the signals generated at output junction points by one $V_{BE}$ drop and also provide drive capability by isolating the output junction points from the loads. The use of the emitter followers enables the outputs of the gate to be ored as shown in FIG. 2.

The operation of the threshold logic gate is set forth in copending application, Ser. No. 61,678, entitled "Multi-Function Logic Gate Circuits" filed Aug. 6, 1970, by the present inventor and assigned to the assignee of the present application. For ease of presentation, the following definitions and explanations are given here.

The voltages at the output terminals are compared to a reference potential which could be any arbitrarily selected value. However, to make a plurality of gates compatible with each other, all outputs are compared to a well defined threshold level defined in this specification as $V_{REF}$. Therefore, by referencing all outputs to $V_{REF}$, the outputs of a gate are compatible with the input requirements of successive gates (not shown) to which they may be directly connected. An input signal ($V_1 \ldots V_n$) or a signal at the output terminals ($T_{ai}$, $T_{bi}$) whose potential is greater than $V_{REF}$ is defined in logic 1 while a signal whose potential is less than $V_{REF}$ is defined as logic 0.

Note that for a potential of $V_{REF}$ at the output terminals ($T_{ai}$, $T_{bi}$) the corresponding potential at the output junction points ($O_{ai}$, $O_{bi}$) is $V_{REF} + V_{BE}$ which is defined here as $V_{REF}$ . For ease of description in this specification, a voltage level at any of the output junction points ($O_{ai}$ or $O_{bi}$) which causes a potential of less than $V_{REF}$ to be produced at its associated output terminal is called a "low" or logic 0 signal and a voltage level at either of these output junction points which causes a potential of more than $V_{REF}$ to be produced at its associated terminal is called a "high" or logic 1 signal.

Each pair of transistors (e.g., 10*a*, 10*b*) is a means for supplying a given amount of current to summing network 11 or to summing network 13. Each pair of transistors is a signal control means and may be considered a switch means or a comparator. Each comparator conducts a current through its *a* side when the amplitude of its input signal is greater (more positive than) than the reference potential $V_{REF}$ and passes approximately the same current through its *b* side when the amplitude of the input signal is lower than $V_{REF}$.

It may be assumed in the explanation which follows, that the current flowing through the resistor R of a comparator is some constant value $I_1$ which either arrives from the *a* transistor (when it is conducting and the b transistor is cut off) or the *b* transistor (when the *b* transistor is conducting and the *a* transistor is cut off). This assumption is reasonably correct and, if desired, may be made more correct by substituting a transistor constant current source for the resistor R.

The number of current switches 1 through Z need not be equal to the number of summing resistors, neither need the number of resistors in summing network 11 be equal to the number of resistors in summing network 13. However, for ease of the explanation to follow, it is assumed that the number of resistors in the two summing networks are equal and that they equal the number of current switches. Also, for ease of explanation, the description will be limited to the *b* side of the circuit. It should, however, be evident that the operation of the *a* side of the circuit is the same as that of the *b* side, taking into account the phase change.

The currents flowing through the *a* side of the comparators are summed at node 30 connecting the *a* sides in common and produce voltage drops across the resistors ($R_{ai}$) of summing network 13. Similarly, the currents in the *b* side of the comparators are summed and flow through the resistors ($R_{bi}$) of summing network 11. In going down from terminal 22 to either terminal 28 or 30, the voltage at each succeeding node is equal to the current voltage through the summing network multiplied by the sum of the ohmic value of the resistors above the node. Each resistor, as detailed below, may be chosen to produce a different logic function.

A qualitative understanding of the invention may be obtained from the following example. The OR function is produced at junction point $O_{b1}$. That is, when one or more of the input signals ($V_1 \ldots V_z$) is high (corresponding to the condition of up to ($n$-1) units of current flowing through the summing network), the voltage level at $O_{b1}$ must be high. When a signal V is high, the *a* transistor to which it is applied conducts current, increasing the conduction of current through network 13 and decreasing it through network 11. Decreased current flow through network 11 means decreased current flow through and decreased voltage drop across resistor $R_{b1}$. This is manifested at node $O_{b1}$ as an increase in voltage level.

When none of the input signals are high (all low and n units of current flow through the summing network 11) the output voltage at $O_{b1}$ must be low. Thus, when n units of current flow through $R_{b1}$ the signal at $O_{b1}$ must be low, but when ($n$-1) units or less of current flow through $R_{b1}$, the signal at $O_{b1}$ must be high. Once a unit of current is defined, the value of $R_{b1}$, as discussed below, can be calculated.

The AND function is produced at junction point $O_{bn}$. That is, when all the input signals are high (and no current flows through the summing network 11), the signal at $O_{bn}$ is high and when one or more of the inputs is low (at least one unit of current flows through the summing network), $O_{bn}$ is low. Thus, when 1 unit of current flows through the summing network 11, the signal at $O_{bn}$ must be low and when no units of current flow through the summing network 11 then the signal at $O_{bn}$ is high.

The values of resistance to produce the AND and the OR functions may be calculated and are related since the voltage level to produce a high ($>V_{REF}$) or a low ($<V_{REF}$) is the same for all functions.

It may be realized from the above that in this circuit the value of resistance necessary to produce the AND function is much larger than the value of resistance necessary to produce the OR function. The value of resistance necessary to produce the AND function can, therefore, include the value of resistance to produce the OR function as well as the value of resistance to produce all functions intermediate the AND and OR functions.

For the condition where $n$ units of current can flow through summing network 11, $n$ integral functions can be produced. The highest order function is the AND function and the lowest order function is the OR function. Also, $n$-2 other possible functions can be produced in between the AND and OR functions.

Passing the load current through N resistors connected in series enables the concurrent production of up to $n$ different functions. The realization that the load resistor can be broken into a series of smaller resistors to concurrently produce many different voltage drops, where each voltage drop represents a different logic function, is an important feature of this invention.

Theoretically these $n$ functions are produced simultaneously since substantially the same current flows through the summing network resistors. In practice, there may be some minor delays along the resistive line due to nodal capacitances. These may be ignored for purposes of the present application, and it may be assumed that all functions are produced simultaneously.

The referenced application, Ser. No. 61,678, teaches how to calculate the value of any summing resistor (denoted by $R_I$) to obtain any given function. This may be expressed as follows:

$$R_I = R_O \; x \; 1/n - (T_I - ½) \qquad (1).$$

Where: $R_O$ is a constant which is a unit of resistance and is equal to $V_{cc} - V_{REF} \; /I_1$ where $I_1$ is a unit of current, which in this embodiment is approximately equal to $V_{REF} - V_{BE}/R$; the threshold ($T_I$) for any one of the outputs on the *b* side is defined as the number of input signals that must be high to cause a *b* output to go high and is an integer which may vary from 1 to $n$.

Setting the value of $T_I$ determines the value of the corresponding summing resistor since the product of the summing resistor and the number of units of current for a given $T_I$ must produce a high output ($V_{oi} > V_{REF}$). There is a one for one correspondence between $T_I$ and $R_I$; that is, $T_1$ corresponds to $R_1$, $T_2$ to $R_2$, and so on with $T_n$ corresponding to $R_n$.

Based on the above, the values of load resistor for obtaining any given function may be calculated. For example, to obtain a high output signal at output $O_{b1}$, $T_I$ in equation 1 is set equal to 1. Note that the condition of $T_I$ equal to 1 specifies that a high output be produced if any one of the n input signals is high. This condition defines the OR function. The value of load resistor ($R_1$) for this condition produces the minimum value ($R_{I_{MIN}}$) of load resistance which from equation 1 is found to equal $R_O \times 2/2n-1$. Note that $R_{I_{MIN}} = R_1$ is identical to $R_{b1}$.

To obtain the value of resistance to produce a high output signal when two or more of the $n$ input signals are high, $T_I$ in equation 1 is set equal to 2. This function (2 out of $n$) is the next higher order function after the OR function and is produced at $O_{b2}$. The value of $R_2$ from equation 1 is found to be:

$$R_2 = R_O \times (1/n - [2 - ½]) = R_O \times (2/2n - 3)$$

$R_2$ defines the total resistance between terminal $O_{b2}$ and terminal 22. $R_2$ includes resistor $R_{b1}$. Therefore, the incremental value of resistance between terminals $O_{b1}$ and $O_{b2}$ may be calculated by substracting $R_2$ from $R_1$. This may be expressed mathematically as follows:

$$R_{b2} = (R_O/n - [2 - ½]) - (R_O/n - [1 - ½])$$ which yields: $R_{b2} = R_O \; 1/n^2 - 2n + ¾$ In general, each incremental value of resistance between an output junction $O_{bi}$ and the next output junction $O_b(i+1)$ may be calculated as follows:

$$\Delta R_b = R_O \left[\, 1/n - (T_i = 1 - ½) - 1/n - (T_i - ½) \,\right]$$

$$\Delta R_b = 1/n^2 - 2n\, T_i + T_i^2 - ¼ \quad (2).$$

Where $T_i$ is the threshold value for the function at output junction $O_{bi}$.

Thus each incremental value of resistance may be calculated to produce a different one of n possible functions.

The maximum value of resistance $R_{I_{MAX}}$ is needed to produce the AND function. There is produced at output $O_{bn}$ a high output when all the $n$ input signals are high. That is, for $n$ out of n outputs high, the signal at $O_{bn}$ is high. For this condition, $T_i$ in equation 1 is set equal to $n$ and $R_{I_{MAX}}$ is found from equation 1 to be equal to $2 \times R_o$. $R_{I_{MAX}}$ includes the $n$ resistors that may be connected in series between terminals 22 and 28 to produce $n$ different functions and may be expressed as $$\sum_{i=1}^{n} R_{bi}$$

The range of resistance to produce $n$ possible functions thus varies from $2R_o/2n-1$ to $2 \times R_o$.

The present invention thus teaches that a summing network may be formed of $n$ subcomponents to produce $n$ different logic functions. This is in sharp contrast to the prior art which teaches, for example, the production of one function at one output (e.g., 28) and the production of a different function at another output (30).

The above discussion has been limited to the $b$ side (summing network 11) of the circuit. It should, however, be evident that the same equations hold for determining the values of the resistors in summing network 13. The difference between the $a$ and the $b$ side is that at the latter the output signals are in phase with the input signals and at the former the signals are out-of-phase. The functions produced in the $a$ side are the complements of the dual of the function produced on tthe $b$ side. For example, at $O_{a1}$ there is produced the NAND function which is the complement of the dual of the OR function which is produced at $O_{b1}$. Thus up to n functions may be produced on the $a$ side in addition to the n functions which may be produced on the $b$ side for a total of $2n$ functions.

For a specific example assume the number of current switches ($n$) to be 3 and that each current switch carries a unit of current ($I_1$) of 2 milliamperes. Assume the value of $V_{CC}$ to be 5 volts, that of $V_{REF}$ to be 3 volts and that ground potential is applied to terminal 20. $V_{BE}$ is assumed to be 0.8 volts. $V_{REF_1} = (V_{REF} + V_{BE})$ is therefore equal to 3.8 volts and Ro is 600 ohms. The values of $R_{b1}$, $R_{b2}$ and $R_{b3}$ from equations 1 and 2 are respectively 240 ohms, 160 ohms, and 800 ohms. With reference to FIG. 1, resistor $R_{b1}$ would be connected between terminals 22 and $O_{b1}$, resistor $R_{b2}$ would be connected between terminals $O_{b1}$ and $O_{b2}$, and resistor $R_{b3}$ would be connected between terminals $O_{b2}$ and $O_{b3}$. Terminal $O_{b3}$ would be connected or be identical with terminal 28.

The potentials at the various output points for the conditions of 0, 2, 4, or 6 milliamperes of current flowing through the series network is given in the table below.

| Summing Network Current | $V_{ob1}$ | $V_{Tb1}$ | $V_{ob2}$ | $V_{Tb2}$ | $V_{ob3}$ | $V_{Tb3}$ |
|---|---|---|---|---|---|---|
| Milliamperes | Volts | Volts | Volts | Volts | Volts | Volts |
| 0 | +5 | 4.2 Hi | 5 | 4.2Hi | 5 | 4.2 Hi |
| 2 | 4.52 | 3.72Hi | 4.2 | 3.4Hi | 2.6 | 1.8 Lo |
| 4 | 4.04 | 3.24Hi | 3.4 | 2.6Lo | 0.2 | — Lo |
| 6 | 3.560 | 2.760Lo | 2.6 | 1.8Lo | — | — Lo |

From FIG. 2 it may be deduced that if an $n$ input gate had all possible series resistors on both output sides, it would provide 2 $n$ functions of the $n$ input variables. Since each output would be derived from an emitter follower connected to each resistor, the virtual OR function can be performed between certain pairs (one from the a side and one from the $b$ side) of the $2n$ outputs to derive yet other functions. For example, the NOR output ($T_{an}$) can be ORED with the AND output ($T_{bn}$) to give the matching function of the n inputs--all 1 or all 0. This connection is shown in FIG. 2.

As another example, the NOR output can also be ORED with each increasing function on the $b$ side except the OR function (which would always produce a high output), thus producing ($n$-1) new functions. Some of these possible connections are shown by dashed lines in FIG. 2. Similarly the $T_{(n-1)}$ output can be ORED with each function on the $b$ side up to $T_{b2}$ giving ($n$—2) new functions. The total number of functions attainable by virtual OR functions is then:

$$\text{Functions} = (n-1) + (n-2) + \ldots [n-(n-1)] = (n-1)!$$

Subject to slight delays due to nodal capacitances, all of the functions taken from the summing resistors and from ORING transistors are simultaneously available. Changes on input connections can result in more functions as follows:

Since each input switch is best realized as a constant current switch, it is immaterial whether an input appears on the left or right side. Hence by interchanging any input variable and the reference, the output functions can reflect the effect of inverted inputs. Each one of the $2^n$ combinations of the input variables can effectively be applied to the gate by connecting to the left or right side switch inputs. However, half of these would result in duplicated outputs. Hence $2^{n-1}$ input combinations will result in different output functions. The total number of functions then available from a gate is:

$$F = [2n + (n-1)\,!]\, 2^{n-1}$$

Where:

The $2n$ term represents one functions per resistor for $2n$ resistors; the ($n$—1)! term is a result of the virtual OR functions; and the $2^{n-1}$ term results from changing input connections to the switches.

It has thus been shown that a multitude of functions may be generated by splitting the summing network into $n$ subcomponents and then oring the functions produced.

Coupling the output nodes to the output terminals has been achieved by means of bipolar transistors operated as emitter followers. However, it should be evident that field effect transistors could be used instead to perform the voltage follower action. Similarly field effect transistors or any other equivalent device could be used to perform the comparison functions and the emitter follower function.

What is claimed is:

1. In combination with a plurality of signal controlled means for supplying current to a line where each signal controlled means is responsive to an input signal representing a binary digit, and either does or does not supply a current to said line depending upon the value of the binary digit its input signal represents, the improvement comprising:

a summing network comprising N impedance elements connected in series between said line and a point of potential for carrying the line current, the current through each one of said impedance elements varying in proportion to said input signals, said summing network including means for simultaneously producing up to N different logic functions of the input signals applied to said signal controlled means in response to said line current flowing therethrough where N is an integer greater than 1.

2. In combination with a plurality of signal controlled means for supplying current to a line where each signal controlled means is responsive to an input signal representing a binary digit, and either does or does not supply a current to said line depending upon the value of the binary digit its input signal represents, the improvement comprising:

a summing network connected between said line and a point of operating potential for carrying substantially all of said line current, said summing network concurrently producing up to N different logic functions of the input signals applied to said signal controlled means in response to the current flowing therethrough, said summing network comprised solely of N resistors connected in series, the ccurrent through each one of said resistors varying in proportion to said input signal, each succeeding resistor in going from said point of operating potential to said line for producing a different one of said N logic functions, where N is greater than 1.

3. A threshold logic circuit comprising:

a plurality of current switches, each current switch having a first input terminal adapted to receive an input signal and a second input terminal adapted to receive a reference signal, and first and second output lines for conducting a load current on said first output line when said input signal is of greater amplitude than said reference signal and for conducting approximately the same load current on said second output line when said input signal is of lower amplitude than said reference signal;

means coupling the first output line of each said current switches in common to a first current carrying line, and means coupling the second output line of each said current switches in common to a second current carrying line; and a summing network, for concurrently producing up to N different logic functions of the input signals applied to said current switches, connected to one of said first and second current carrying lines for carrying its current, said summing network including N different valued resistors connected in series, each resistor for producing a different one of said N functions in response to the line current flowing therethrough, where said line current flowing therethrough varies in proportion to said input signals, and where N is an integer greater than 1.

4. A threshold logic circuit comprising:

a plurality of current switches, each current switch having a first input terminal adapted to receive an input signal and a second input signal adapted to receive a reference signal, and first and second output lines for conducting a load current on said first output line when said input signal is of greater amplitude than said reference signal and for conducting approximately the same load current on said second output line when said input signal is of lower amplitude than said reference signal;

means coupling the first output line of each of said current switches in common to a first current carrying line, and means coupling the second line of each said current switches in common to a second current carrying line; and a summing network connected to one of said first and second current carrying lines for conducting the line current and for concurrently producing up to N different logic functions of the input signals applied to said current switches, said summing network including N resistors connected in series, the current through each resistor varying in direct proportion to said input signals, one end of each resistor defining an output node for producing thereat a different one of said N functions in response to the line current flowing through the summing network, where N is an integer greater than 1.

5. The combination as claimed in claim 4:

wherein said summing network is connected at one end to a point of reference potential and at the other end to said one of said first and second carrying lines;

wherein in going from the point of potential to said output lines, the junction of each resistor with a succeeding resistor defines an output node, except for the nth output node which is formed by the junction of the nth resistor and said one of said current carrying line, each output node for producing thereat a logic function which is determined by the current flow through the summing network and the sum of the resistance between that node and the point of reference potential.

6. The combination as claimed in claim 5 wherein the value $R_I$ of resistance between an output node at which a signal is to be produced indicative of a given logic function, and said point of reference potential is $$R_I = R_O/N - (T_I - C_1)$$

where:

$R_O$ is a constant expressed in ohms;

$N$ is a constant equal to the maximum number of functions desired to be produced;

$T_I$ is an integer in the range from 1 to $N$ and defines which function is to be produced; $C_1$ is a constant approximately equal to ½; and wherein the incremental value of resistance between adjacent nodes is the difference between the $R_I$ for a given logic function at an output node and the $R_I$ defining a function at the preceding node.

7. The combination as claimed in claim 6 further including a plurality of voltage followers, each voltage follower having an input node and an output terminal wherein each voltage follower is connected at its input terminal to a different one of said N output nodes for translating the signal to its output terminal.

8. The combination as claimed in claim 4 further including a second summing network for concurrently producing up to M different logic functions of the input signals applied to said signal controlled means, said second network including M resistors connected in series and being connected to the other one of said first and second output lines, where M is an integer greater than one.

9. The combination as claimed in claim 8:

wherein one end of each resistor forms an output node for producing thereat a different one of said M function;

a plurality of voltage followers, each voltage follower having an input node and an output terminal and wherein each voltage follower is connected at it input node to a different one of said M and N output nodes for translating the signal at the output node to its output terminal.

10. The combination as claimed in claim 9 further including means for coupling selected ones of the output terminals for producing selected combinational logic functions.

11. The combination as claimed in claim 9 further including means for coupling selected ones of the output terminals from the first summing network with selected ones of the output terminals from the second summing network for producing selected combinational logic functions.

* * * * *

UNITED STATES PATENT OFFICE

CERTIFICATE OF CORRECTION

Patent No. 3,825,770 Dated July 23, 1974

Inventor(s) Daniel Hampel

It is certified that error appears in the above-identified patent and that said Letters Patent are hereby corrected as shown below:

Col. 2, line 35 "in" should be --- as---

Col. 3, line 21 "voltage" should be -- flowing--

Col. 4, line 29 "$V_{REF}$" should be --- $V_{REF_1}$---

Col. 5, line 4 "$(T_1 = 1 - 1/2)$" should be ---$(T_1 + 1 - 1/2)$---

Col. 6, line 37 "$T_{(n-1)}$" should be --- $T_{a(n-1)}$---

Signed and sealed this 7th day of January 1975.

(SEAL)
Attest:

McCOY M. GIBSON JR.
Attesting Officer

C. MARSHALL DANN
Commissioner of Patents